United States Patent
Hoch et al.

(10) Patent No.: US 10,006,130 B2
(45) Date of Patent: Jun. 26, 2018

(54) PHOTOELECTROCHEMICAL CELL, SYSTEM AND PROCESS FOR LIGHT-DRIVEN PRODUCTION OF HYDROGEN AND OXYGEN WITH A PHOTOELECTROCHEMICAL CELL, AND PROCESS FOR PRODUCING THE PHOTOELECTROCHEMICAL CELL

(71) Applicants: Sascha Hoch, Bochum (DE); Matthias Blug, Witten (DE); Jens Busse, Bochum (DE); Wolfram Calvet, Berlin (DE); Bernhard Kaiser, Darmstadt (DE); Wolfram Jaegermann, Gross-Umstadt-Kleestadt (DE); Hanna Hahn, Duisburg-Baerl (DE); Horst-Werner Zanthoff, Muelheim a.d. Ruhr (DE)

(72) Inventors: Sascha Hoch, Bochum (DE); Matthias Blug, Witten (DE); Jens Busse, Bochum (DE); Wolfram Calvet, Berlin (DE); Bernhard Kaiser, Darmstadt (DE); Wolfram Jaegermann, Gross-Umstadt-Kleestadt (DE); Hanna Hahn, Duisburg-Baerl (DE); Horst-Werner Zanthoff, Muelheim a.d. Ruhr (DE)

(73) Assignee: Evonik Degussa GmbH, Essen (DE)

( * ) Notice: Subject to any disclaimer, the term of this patent is extended or adjusted under 35 U.S.C. 154(b) by 327 days.

(21) Appl. No.: 14/389,564
(22) PCT Filed: Mar. 15, 2013
(86) PCT No.: PCT/EP2013/055416
§ 371 (c)(1),
(2) Date: Sep. 30, 2014
(87) PCT Pub. No.: WO2013/143885
PCT Pub. Date: Oct. 3, 2013

(65) Prior Publication Data
US 2015/0068915 A1   Mar. 12, 2015

(30) Foreign Application Priority Data

Mar. 30, 2012 (DE) .................. 10 2012 205 258

(51) Int. Cl.
C25B 1/00 (2006.01)
C25B 1/04 (2006.01)
(Continued)

(52) U.S. Cl.
CPC ............... *C25B 1/003* (2013.01); *C25B 1/04* (2013.01); *C25B 1/10* (2013.01); *C25B 9/08* (2013.01);
(Continued)

(58) Field of Classification Search
CPC .... Y02P 20/135; Y02E 60/366; H01L 31/076; C25B 1/003; C25B 1/10; C25B 9/08;
(Continued)

(56) References Cited

U.S. PATENT DOCUMENTS 8,884,070 B2   11/2014   Franke et al.
2003/0062080 A1   4/2003   Satoh et al.
(Continued)

FOREIGN PATENT DOCUMENTS

CN   1849413 A   10/2006
CN   101575713 A   11/2009
(Continued)

OTHER PUBLICATIONS

International Search Report dated May 29, 2013 in PCT/EP2013/055416.
(Continued)

*Primary Examiner* — Ibrahime A Abraham
*Assistant Examiner* — Colleen M Raphael
(74) *Attorney, Agent, or Firm* — Oblon, McClelland, Maier & Neustadt, L.L.P.

(57) ABSTRACT

The invention relates to a photoelectrochemical cell 100 for light-driven production of hydrogen and oxygen, especially from water or another electrolyte based on aqueous solution, (Continued)

Figure 1:
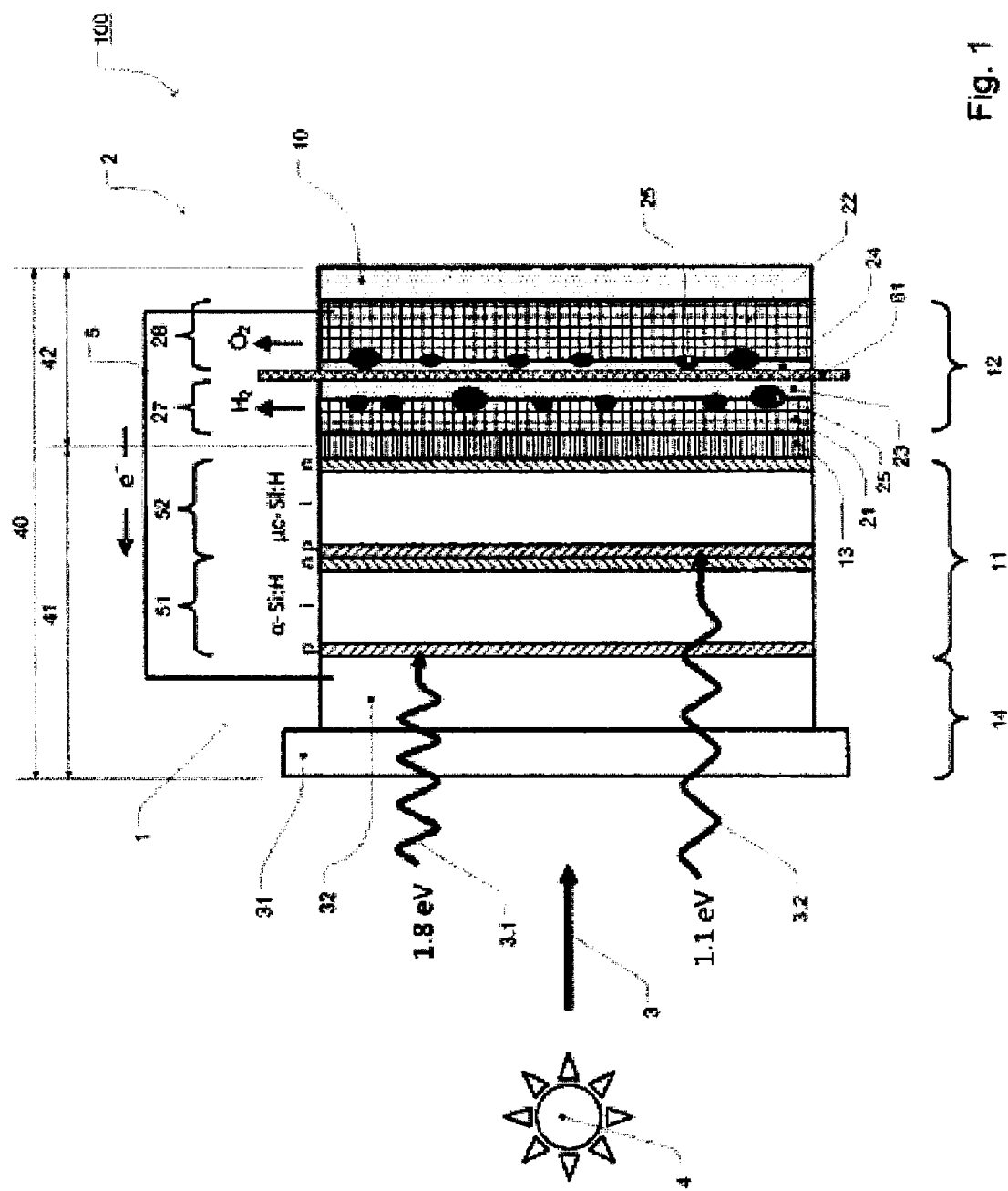

having a photoelectric layer structure 1 and an electrochemical layer structure 2 in a layer construction 40, where—the photoelectric layer structure 1 for absorption of light 3 uninfluenced by the electrolyte 10 forms a front side 41 of the layer structure 40, and—the electrochemical layer structure 2, for accommodation of the electrolyte 10, forms a reverse side 42 of the layer construction 40, and—a conductive and corrosion-inhibiting coupling layer 13 forms electrical contact between the photoelectric layer structure 1 and the electrochemical layer structure 2 in the layer construction 40, where—the electrochemical layer structure 2 has an electrode structure of a front electrode 21 and an electrode structure of a rear electrode 22, between which is arranged an ion exchange layer 61 such that an integrated layer construction 40 is formed with the ion exchange layer 61 in contact with the electrode structure of the front electrode 21 formed for conversion of the electrolyte 10 and/or with the electrode structure of the rear electrode 22.

19 Claims, 3 Drawing Sheets

(51) Int. Cl.
  *C25B 9/10* (2006.01)
  *C25B 9/08* (2006.01)
  *C25B 11/04* (2006.01)
  *C25B 1/10* (2006.01)
  *C25B 11/03* (2006.01)
  *H01L 31/076* (2012.01)

(52) U.S. Cl.
  CPC .............. *C25B 9/10* (2013.01); *C25B 11/035* (2013.01); *C25B 11/04* (2013.01); *H01L 31/076* (2013.01); *Y02E 60/368* (2013.01); *Y02P 20/135* (2015.11)

(58) Field of Classification Search
  CPC .. C25B 1/04; C25B 9/10; C25B 11/04; C25B 11/035
  USPC ........................................................ 205/340
  See application file for complete search history.

(56) References Cited

U.S. PATENT DOCUMENTS

| | | |
|---|---|---|
| 2005/0205128 A1 | 9/2005 | Deng et al. |
| 2005/0211290 A1 | 9/2005 | Deng et al. |
| 2007/0246370 A1 | 10/2007 | Dimroth |
| 2008/0073205 A1* | 3/2008 | Adiga ................ C25B 9/08 204/263 |
| 2008/0223439 A1* | 9/2008 | Deng .................. C25B 1/003 136/258 |
| 2010/0133110 A1* | 6/2010 | Nocera ............... C25B 1/003 205/340 |
| 2011/0214996 A1 | 9/2011 | Yoshida et al. |
| 2012/0187387 A1 | 7/2012 | Sekiguchi et al. |
| 2012/0279566 A1 | 11/2012 | Bruder et al. |
| 2013/0178657 A1 | 7/2013 | Franke et al. |
| 2014/0023582 A1 | 1/2014 | Nordhoff et al. |

FOREIGN PATENT DOCUMENTS

| | | |
|---|---|---|
| CN | 102171840 A | 8/2011 |
| JP | 2006-508253 A | 3/2006 |
| JP | 2011-116581 A | 6/2011 |
| JP | 2013-105632 A | 5/2013 |
| WO | WO 2005/006391 A2 | 1/2005 |
| WO | WO 2005/007932 A2 | 1/2005 |
| WO | WO 2010/019685 A1 | 2/2010 |

OTHER PUBLICATIONS

Gerhard Peharz et al., "Solar Hydrogen Production by Water Splitting with a Conversion Efficiency of 18%", International Journal of Hydrogen Energy, vol. 32, No. 15, XP-022300504, Jun. 27, 2007, pp. 3248-3252.

O. Khaselev et al., "High-efficiency Integrated Multijunction Photovoltaic/electrolysis Systems for Hydrogen Production", International Journal of Hydrogen Energy, vol. 26, No. 2, XP-004312324, Feb. 1, 2001, pp. 127-132.

"Technologies for Hydrogen Production and Storage", Ding, Fuchen, Chemical Industry Press, 1st Edition Jan. 2006, Section 2.1.3, pp. 33-37.

Joep J.H. Pijpers et al., "Light-induced water oxidation at silicon electrodes functionalized with a cobalt oxygen-evolving catalyst", PNAS, Jun. 21, 2011, vol. 108, No. 25, pp. 10056-10061.

Oscar Khaselev, et al., "A Monolithic Photovoltaic-Photoelectrochemical Device for Hydrogen Production via Water Splitting", Science, vol. 280, Apr. 17, 1998, pp. 425-427.

Combined Chinese Office Action and Search Report dated Feb. 23, 2016 in Patent Application No. 201380018724.2 (with Partial English Translation).

* cited by examiner

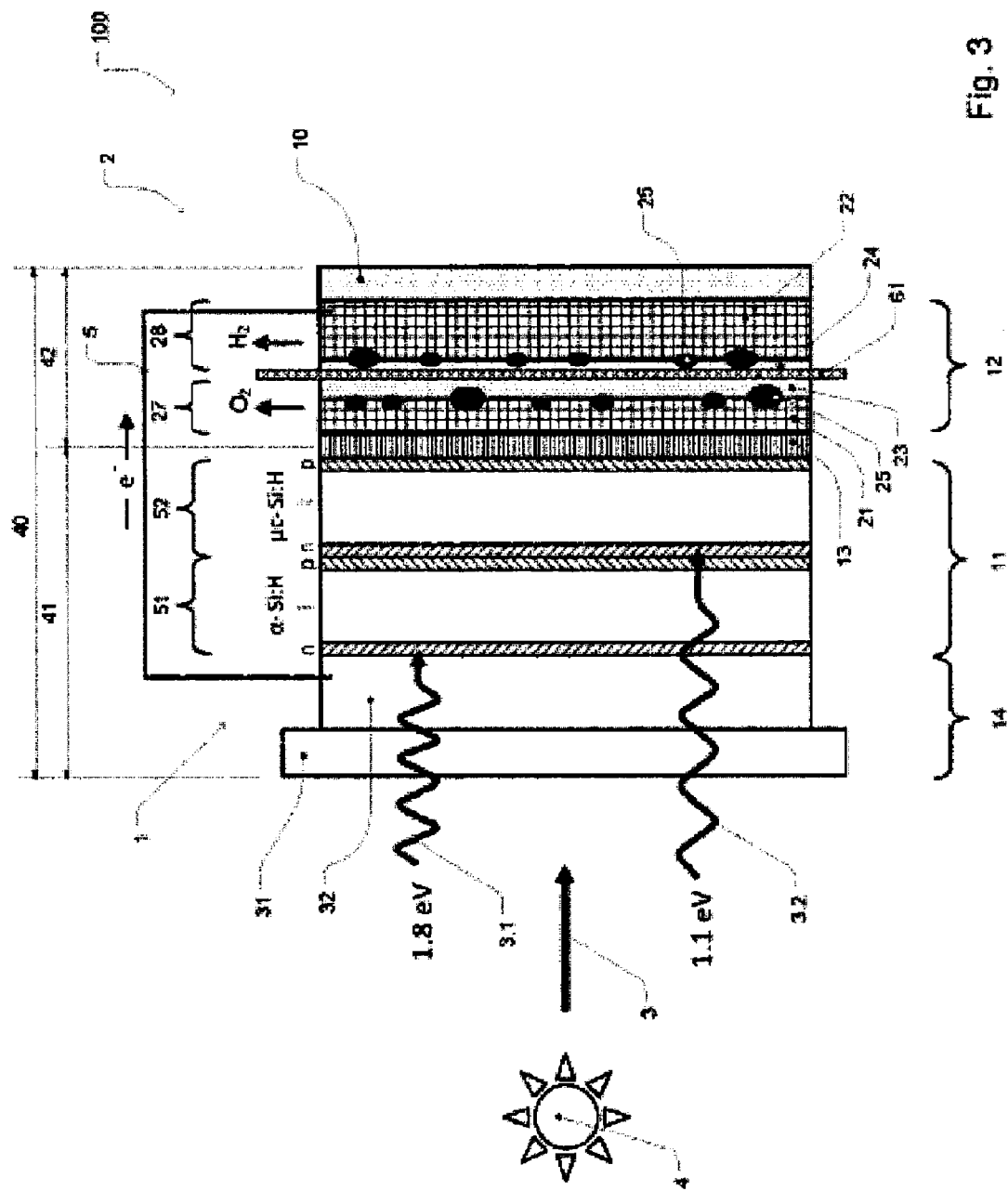

US 10,006,130 B2

PHOTOELECTROCHEMICAL CELL, SYSTEM AND PROCESS FOR LIGHT-DRIVEN PRODUCTION OF HYDROGEN AND OXYGEN WITH A PHOTOELECTROCHEMICAL CELL, AND PROCESS FOR PRODUCING THE PHOTOELECTROCHEMICAL CELL

This application is a National Stage of PCT/EP2013/055416, which was filed on Mar. 15, 2013. This application is based upon and claims the benefit of priority to German Application No. 10 2012 205 258.5, which was filed on Mar. 30, 2015.

The invention relates to a photoelectrochemical cell for production of hydrogen and oxygen, especially from water or another electrolyte based on aqueous solution. The invention also relates to a system having a multitude of such photoelectrochemical cells having at least one first and one second cell. The invention also relates to a process for light-driven production of hydrogen and oxygen, especially from water or another electrolyte based on aqueous solution, with a photoelectrochemical cell. The invention also relates to a process for producing a photoelectrochemical cell.

On the industrial scale, hydrogen is prepared typically via the process of steam reforming, in which hydrogen is obtained in two process steps from hydrocarbons such as natural gas, mineral oil, biomass etc. The costs of this process are relatively highly and strongly coupled to general energy prices. Moreover, large amounts of the climatically harmful gas $CO_2$ are formed. For the use of hydrogen as a renewable fuel, it will therefore be necessary in future to develop competitive plants. The direct photoelectrochemical production of hydrogen is a variant of very high industrial interest for this purpose. With light-driven production of hydrogen and oxygen from water or another electrolyte based on aqueous solution using a photoelectrochemical cell, it is possible to make the costs for production of hydrogen competitive with the methods currently used. Moreover, the preparation of hydrogen with a photoelectrochemical cell is virtually climatically neutral, which means that barely any additional $CO_2$ forms during the process. Specifically, with the aid of solar-generated hydrogen, solar energy can be converted to chemical energy and thus to a better-storable form. Conversion by means of a photoelectrochemical cell allows industrial scale use and—with the production of hydrogen—problems of fluctuating energy provision associated with renewable energy generation forms are solved. The use of photoelectrochemical cells is considered to be ecologically viable, since the combustion of hydrogen with oxygen to give water is climatically neutral and environmentally compatible.

There now exists a good state of knowledge about the electrochemical production of hydrogen with direct conversion, as detailed, for example, in WO 2005/007932 A2. There are simple approaches for coupling of photovoltaic and electrochemical systems, as described, for example, in DE 10 2004 050 638 B3. Basic prerequisites for industrial scale provision of thin-film solar cells on a large-area substrate to obtain electrical energy are considered, inter alia, by Pijpers et at in PNAS Early Edition, pages 1 to 6 under www.pnas.org/cgi/doi/10.1073/pnas.1106545108 "Light-induced water oxidation at silicon electrodes functionalized with a cobalt oxigen-evolving catalyst". The articles by Khaselev et al in SCIENCE Vol. 280, pages 425 to 427 and International Journal of Hydrogen Energy 26 (2001), pages 127 to 132 show a further approach for provision of photoelectrochemical systems, for instance for a III-V tandem cell or silicon-based triple cell with an electroplated platinum electrode as a counterelectrode.

Nevertheless, all systems lack adequate efficiency, the reason for which is ultimately that the integration of the electrochemical cell is still in need of improvement. While the problem of comparatively thin and stable light absorbers in photovoltaic cells at the physical limits appears soluble, there nevertheless exist considerable problems with respect to effective electronic coupling between the solid light absorber and the liquid electrolyte in an electrochemical cell, i.e. at the coupling boundary between photovoltaic cell and electrochemical cell. Charge transport between the light absorber and the redox system, based on the electrolyte, in an electrochemical cell is also still in need of improvement. All systems known to date expose the electrochemical cell and the photovoltaic cell to the usually acidic electrolyte on all sides, which leads to not inconsiderable stability problems at least for the photovoltaic cell. It is also found that couplings which have been addressed between solid photovoltaic cell and partly liquid electrolyte of the electrochemical cell are difficult; this leads to high resistances at the input at least of the electrochemical cell, which lowers the efficiencies of the overall photoelectrochemical cell well below 10%.

What would be desirable would be an improved system solution for the photoelectrochemical cell which encompasses not just the photovoltaic cell and parts of the electrochemical cell but also all components of the photovoltaic cell and of the electrochemical cell, and more particularly takes account of the electrolyte.

This is the starting point of the invention, the object of which is to specify an apparatus and a process for light-driven production of hydrogen and oxygen from water or another electrolyte based on aqueous solution. More particularly, a photoelectrochemical cell in an improved design is to be provided, this also comprising all components, especially a photovoltaic cell and an electrochemical cell, and preferably also the electrolyte. More particularly, the photoelectrochemical cell is to be suitable for industrial scale production, and is preferably to be of comparatively simple construction and producibility; the cell should also be of maximum sustainability, stability and lifetime. More particularly, harmful influences of the electrolyte on the photoelectrochemical cell, such as corrosion or the like, should be lowered. More particularly, it should be possible to improve absorber properties of the photovoltaic cell, unaffected by influences of the water or other aqueous electrolytes. More particularly, the overall electronic resistance of the photoelectrochemical cell should be reduced. This preferably relates not just to a photovoltaic cell with reduced resistance, but in particular to an efficiency-optimized electronic coupling between photovoltaic cell and electrochemical cell, and improved charge transport between light absorber and redox system.

The object with regard to the apparatus is achieved by a photoelectrochemical cell having the features of claim 1, and a system composed of a multitude of photoelectrochemical cells as described herein. The object with regard to the process is achieved by a process for light-driven production of hydrogen and oxygen from water or an electrolyte based on aqueous solution with a photoelectrochemical cell according to the features described herein. The object also leads to a process for producing a photoelectrochemical cell having the features described herein.

A front side of the layer assembly does not necessarily refer to a front surface of the layer assembly or of the photoelectrochemical cell, but merely indicates the side intended for incidence on light. A front side of the layer assembly may be a surface or else a side covered by one or more further layers. A back side of the layer assembly does not necessarily refer to a back surface of the layer assembly or of the photoelectrochemical cell, but merely indicates a side intended to face away from the incidence of light. A back side of the layer assembly may be a surface or else a side covered by one or more further layers.

The invention proceeds from the idea that the overall efficiency of a photoelectrochemical cell is restricted by physical limits and additionally by a need for improvement in the efficiency design. This relates more particularly to the region of the electrochemical cell and the electronic coupling mechanisms thereof, and charge transport at the coupling boundary of the light-absorbing system in the photovoltaic cell and of the redox systems in the electrochemical cell. The invention has recognized that it is advantageous for an industrial scale implementation to solve these and other coupling problems.

The invention has recognized that this can be achieved within an all-encompassing, integrated approach to form the overall photoelectrochemical cell. More particularly, not just individual components but the entire assembly of a photoelectric layer structure and an electrochemical layer structure are implemented systematically in an integrated layer assembly which goes beyond mere coupling of modular systems. More particularly, in the context of the integrated layer assembly, an efficiency-optimized layer structure is formed by individual layers whose electrical and chemical properties are matched to one another.

This allows the properties of the electrolyte and the charge transfer and hence the energy transfer at the boundary between the light-absorbing system, especially a solar cell, and the redox system, especially an electrochemical reactor, to be efficiency-optimized. This enables the systematic implementation of an integrated layer assembly in the region of the electrochemical cell and/or electrochemical cell, with corresponding consequences for the production process for a photoelectrochemical cell. Specifically, a photoelectric layer structure for absorption of light unaffected by the water or another aqueous electrolyte forms a front side of the layer assembly, and an electrochemical layer structure for accommodation of the electrolyte a back side of the layer assembly, the photoelectric layer structure and the electrochemical layer structure being electrically contacted with one another in the layer assembly via a conductive and corrosion-inhibition coupling layer. Preferably, the photoelectric layer structure and the electrochemical layer structure are integrated as a sequence of layers applied individually in assembly direction in a single layer sequence in the layer assembly. Preferably, the layers are applied individually and successively, more particularly without interruption. Preferably, the electrochemical layer structure takes form of an electrocatalytic layer structure and thus combines electrochemical and electrocatalytic functionalities.

The concept of the invention is based in particular on a functioning efficiency-optimization of the charge coupling and the charge transfer at the relevant system boundaries, mainly at the boundary of the light-absorbing system from the redox system, and also in the electrochemical cell. In addition, on the basis of the concept of the invention, optimization of resistance at the system boundaries of the photoelectrochemical cell is possible. As recognized by the invention, an all-encompassing design approach can be undertaken, inter alia, for the electrochemical potentials and band structures or Fermi levels involved; in other words, not just but particularly at the boundary of an electrochemical cell and a photovoltaic cell.

The proposed concept forms the constructive basis for efficiency optimization of electron transport—especially at the boundary between the light-absorbing system and the redox system, and also in the redox system—in the photoelectrochemical cell (PEC cell). In addition, this is achieved by virtue of an ion exchange layer of the electrochemical cell being in contact with an electrode structure of the front electrode and/or back electrode provided for conversion of the water or another aqueous electrolyte, to form a fully integrated layer assembly of the photoelectrochemical cells.

In addition, in a synergistic manner, corrosion-inhibiting contact connection of photoelectric layer structure and the electrochemical layer structure is undertaken on the side of the photoelectric layer structure facing away from the light. This prevents the electrochemical destruction of the semiconductor structure of a solar cell in contact with the electrolyte. Moreover, a corrosion-inhibiting coupling layer allows basic freedom of design with regard to the implementation of the photoelectric layer structure. More particularly, by means of a "face-to-face" electrode arrangement, i.e. by means of a layer arrangement of the electrodes essentially without a clear separation, a comparatively compact reaction space can be provided for the electrochemical reactor, this firstly constituting a considerable optimization of the resistance of the electrolyte-containing constituent of the PEC cell and secondly enabling efficient electrochemical water dissociation.

In addition, the concept offers the possibility of direct irradiation of the photoelectric layer structure without having to accept absorption influences by water or other aqueous electrolytes. More particularly, there are no losses through absorption in the water or another aqueous electrolyte. There are also no losses through absorption at catalytic layers and back-scatter losses at bubbles of the product gases in water or an aqueous electrolyte. In this respect, water may include any kind of pH-neutral electrolyte; other aqueous electrolytes—basic or acidic—are possible.

Advantageous developments of the invention can be found in the dependent claims and each specify advantageous options for implementing the concept explained above in the context of the objective and with regard to further advantages.

In a particularly preferred developing variant, the photoelectric layer structure and the electrochemical layer structure are integrated as a sequence of layers applied individually—especially successively and/or without interruption—in assembly direction in a single layer sequence in the layer assembly. An assembly direction may refer, for example, to the direction of growth, deposition or another kind of application of a layer; in other words, regularly a direction at right angles to a substrate or similar base layer. An assembly direction may refer, for example, to the assembly of a photoelectric layer structure on a transparent substrate and then the assembly of an electrochemical layer structure of a contacting coupling layer. Another assembly direction may refer, for example, to the assembly of an electrochemical layer structure on a back electrode and then the assembly of a photoelectric layer structure on a contacting coupling layer.

A transparent and conductive front layer stack may have an optically transparent conductive layer, such as ITO (indium tin oxide), AZO (aluminium-doped zinc oxide), FTO (fluorine-doped tin oxide) or another ZnO or TCO (transparent conductive oxide layer) or similar layer. More particularly, the photoelectric layer structure can be applied to glass, polymethyl methacrylates (e.g. Plexiglas), polycarbonates, polyethylene terephthalate, polyacrylates, polyolefins or a transparent polymer-based substrate based on a conductive polymer (ICP) or mixtures thereof as the transparent substrate.

In another developing variant, the photoelectric layer structure is provided in modular form, in the form of a photovoltaic cell, and/or the electrochemical layer structure is provided in modular form, in the form of an electrochemical cell, and these are assembled by means of the conductive and corrosion-inhibiting coupling layer in the layer assembly. A photoelectric layer structure may preferably be applied as a thin-film solar cell on a transparent and/or at least partly conductive front layer stack, more particularly with provision of texturing on the substrate and/or front layer stack. Further demands are preferably made on the coupling layer and the remaining matching of the modules, and some of these are explained hereinafter.

The electrode structure of the front electrode and/or of the back electrode can be matched in different ways in order to contact an ion exchange layer with sufficient stability to form a layer stack. More particularly, an electrode structure may have suitable configuration to provide reaction spaces for a water-dissociating redox reaction and sufficient permeability for reaction gases. The ion exchange layer may be contacted especially with a functional layer or functional region provided for conversion of water or another aqueous electrolyte. The contact may be a direct contact extending at least in regions over the cross section of the functional layer or of the functional region. More particularly, the contact may be a direct contact extending over part or virtually all of the cross section. Particularly advantageously, the contact is formed by a regular and/or irregular arrangement of contact sites distributed over part or virtually all of the cross section of the functional layer. The exchange layer is preferably a membrane or a frit, but may also be a nonwoven or other ion exchange filter impermeable to the hydrogen and oxygen product gases.

Advantageously, a functional layer provided for conversion of the water or aqueous electrolyte, in a first variant, especially for conversion of the water or aqueous electrolyte, has been applied as a separate layer on a solid front electrode and/or back electrode. In a second variant, especially for conversion of the water of aqueous electrolyte, a functional region may also be formed or processed as a one-piece part of an electrode, i.e. be formed in one piece with the front electrode and/or back electrode, especially by virtue of a surface treatment of a front electrode and/or back electrode. More particularly, a functional layer and/or a functional region is electrically conductive and permeable to product gases. The first and/or second functional layer and/or functional region preferably has a functionality with increases the surface layer of the front electrode and/or back electrode. It is advantageously possible to optimize the redox system of the electrochemical cell per se, by virtue of the suitable formation of the functional layers, for example by the selection of a suitable porosity and of the associated increase in catalytic action.

More particularly, the first and/or second functional layer and/or functional region has pores, orifices or similar accommodation regions for the electrolyte and/or permeability to the process gases (hydrogen and oxygen). In this respect, a solid region of the electrode structure is understood to mean a region which is impermeable or inaccessible to reaction gases. It is thus possible to configure a reaction space advantageously.

Particularly advantageously, the cross section of a functional layer and/or of a functional region corresponds to a cross section of the front electrode and/or of the back electrode. A full-area contact which extends over the full area of the cross section of the functional layer and/or a functional region nevertheless preferably leaves suitable accommodation regions of a functional layer and/or of a functional region which provides sufficient reaction spaces for the water dissociation. More particularly, the cross section of the functional layer and/or of the functional region provided is preferably the cross section of the front electrode and/or of the back electrode. This enables a "face-to-face" electrode arrangement, which is particularly preferred both for the production process and for the construction basis, in the photoelectrochemical cell. Ultimately, this allows a minimal electrode separation which can be reduced virtually to the thickness of the ion exchange layer; it is thus possible to provide a considerable optimization of resistance with respect to the electrolyte in a photoelectrochemical cell.

Useful electrolytes include both liquid neutral, acidic or basic systems and solid acidic or basic systems, though consideration should be given to the harmful influence on the photovoltaic cell system and the other solid components of the photoelectrochemical cell. In a particularly preferred development of the invention, the ion exchange layer is selected such that—for example in the case of use of an acidic or basic polymer electrolyte membrane (PEM) or composite membrane consisting of a polymer membrane with inorganic or ceramic filler materials—it forms a solid electrolyte. A composite membrane in this context is understood to mean a polymer membrane provided with inorganic or ceramic filler materials. More particularly, it is possible to use a polymer electrolyte membrane (PEM) with elevated ion mobility and/or gas-tightness with respect to hydrogen and oxygen. It is preferable that the electrolyte comprises an aqueous solution, preferably having a pH between 5 and 8, the electrolyte especially comprising a 0.01M to 1M solution. More particularly, the use of an aqueous, distinctly basic or distinctly acidic electrolyte may then be substantially dispensable.

The choice of an acidic electrolyte enables the acceleration of the hydrogen-producing reaction. The choice of a catalyst such as platinum, especially in the form of platinum nanoparticles, likewise leads to an acceleration of the hydrogen-producing reaction. More particularly, this is true of an electrolyte which preferably has a pH between 0.7 and 6.9. More particularly, the electrolyte may comprise a 0.01M to 4M $H_2SO_4$, especially a 1M $H_2SO_4$, aqueous solution. More preferably, the electrolyte may be a solution of the alkali metal or alkaline earth metal salts of sulphuric acid or nitric acid or organic acids, especially formic acid, acetic acid and higher homologues or mixtures thereof, or be formed with an acidic polymer electrolyte membrane (PEM).

In another development, an electrolyte by means of a basic aqueous solution has been found to be particularly advantageous; preferably an electrolyte formed with a pH between 7.1 and 14. More particularly, the electrolyte may comprise an alkali metal or alkaline earth metal hydroxide solution, preferably sodium hydroxide solution, potassium hydroxide solution or calcium hydroxide solution, or may be formed of a basic polymer electrolyte membrane (PEM).

The concept also offers the possibility, in the context of further developments, of integrating industrial scale solutions known to date, more particularly in the region of a photoelectric layer structure, viably and without significant efficiency losses in an overall concept of a photoelectrochemical cell, namely by electrically contacting the photoelectric layer structure and the electrochemical layer structure in the layer assembly to one another via a conductive and corrosion-inhibiting coupling layer. For example, the concept offers the possibility of using approaches which are advantageous per se for an a-Si/μc-Si thin-film solar cell optimized, for example, with regard to photovoltage for production of a tandem or triple solar cell, and integration in a fully optimized assembly of a photoelectrochemical cell, without having to accept serious efficiency losses, namely by assembling individual layers whose electrical and chemical properties have been matched to one another to give the integrated layer assembly.

The charge transfer (electrons or holes) between the photoelectric layer structure (for example a silicon-based dual-junction photodiode structure) and the electrochemical layer structure should be optimized by means of suitable coupling layer(s), for example effectively as buffer layers with minimization of charged carrier recombination and of loss of the photovoltage generated. The coupling of the electronic structure and the contact characteristics of the layers can be matched to one another, especially layer for layer. The aim is a coupling layer, especially a coupling layer sequence, as interface(s) with coupling levels at the valence band of the photoelectric energy transducer material for hole reactions, and at the conduction band for electron reactions.

In addition, the controlled engineering of the coupling layer, especially buffer layer, on the photoelectric layer structures constitutes a challenge for efficient coupling with the electrochemically active layer structure. A coupling layer, as a buffer layer, especially advantageous for efficient coupling with the electrochemically active layer structure should more preferably additionally synergistically and simultaneously meet several demands, such as the chemical stabilization and/or transfer of charge carriers from the photodiode to the catalyst, especially without recombination of charge carriers and/or loss of electrochemical potential and/or the integration of multielectron transfer catalysts. For this purpose, layer stacks with matched contact properties can be applied in a controlled manner and without generation of interfacial defects as a layer sequence of coupling layers, and be optimized in terms of the electronic properties with regard to charge transfer.

Generally, the solid-state materials used, such as semiconductor, TCO and metal, both in contact with one another and in contact with the electrolyte, can be optimized for hydrogen production in relation to corrosion resistance and energetic properties, i.e. photovoltage and band matching. It is possible to match semiconductor layer systems for a tandem or triple cell structure using III-V compound semiconductors, for example GaAs/AlGaAs, InP, GaP etc., free of outside conditions and internal factors, for example the electrolyte or the like. The invention thus solves the unsolved stability problem of this class of semiconductor structures with regard to the electrolyte, using sufficient degrees of freedom in the specifications in the operation of a photoelectrochemical cell. For instance, it is also possible to effectively introduce solar cell concepts with efficiencies between 9 and 10% up to 25% into the present concept. More particularly, it is possible, preferably in combination with a porous functional layer and/or electrode, that sufficient reaction space for water or aqueous electrolytes can be provided in the region at least of the ion-conducting exchange layer—such as a membrane, frit or nonwoven—for separation of the two product gas spaces between the solid parts of the electrodes. Moreover, the mixing of the product gases—and hence the reverse reaction thereof to give water—is prevented.

More particularly, the assembly of a "face-to-face" electrode arrangement enables a minimal electrode separation in the region of the membrane thickness. More particularly, the reaction space encompasses not just the membrane but also possibly regions of the functional layer or of the electrode with increased surface area, which can be permeated by the electrolyte. It is preferable that a functional layer is present at least on the electrode provided for hydrogen production, especially the cathode. Preferably, a first functional layer is disposed on the front electrode, especially a cathode, and/or a second functional layer on the back electrode, especially an anode, and the ion exchange layer is in contact with the first functional layer on the front electrode and/or the second functional layer on the back electrode. The functional layers, i.e. the first and second functional layers, may be of different configuration with regard to material, function and spatial extent—the individual configuration may be matched to the function of the front electrode and/or of the back electrode. The choice of materials and the other design parameters may also be matched to industrial scale formation of the integrated layer assembly with direct contacting of the ion exchange layer.

Advantageously, the first and/or second functional layer has a functionality which catalyzes the conversion of the electrolyte at the front electrode and/or back electrode, and this functionality especially bears a catalyst, especially with high surface area. More particularly, the catalyst has one or more active components and a support material.

For example, a catalyst, especially an active component thereof, may be provided in the form of Pt nanoparticles. Especially preferably, catalyst systems low in noble metals, preferably with an active component comprising transition metal compounds or mixtures of transition metal compounds, is used to form the catalyst, especially using element compounds of transition groups IV to XII, for example in the form of structured or porous layers or nanoparticulate systems. More particularly, the active component is based on one or more, especially compounds, of the elements selected from the group of Ti, V, Cr, Mo, W, Mn, Fe, Ru, Co, Ni, Cu, Zn. A measure with an advantageous catalyst selection accelerates the water dissociation.

More particularly, a functional layer and/or functional region provided for conversion of the water or aqueous electrolyte may be electrically conductive and permeable to product gases. For example, a functional layer and/or functional region based on carbon or graphite provided for conversion of the electrolyte has been found to be particularly advantageous. More preferably, a catalyst supported by the electrode structure of the front electrode and/or back electrode is formed as a particulate and/or immobilized molecular form and/or solid and/or porous layers.

In the context of a particularly preferred development, a first functional layer and/or a functional region bears a water-oxidizing catalyst in a surface of increased surface area of the cathodic front electrode and a second functional layer and/or a functional region a water-reducing catalyst in a surface of increased surface area of the anodic back electrode, the ion exchange layer being in contact with the first functional layer and the second functional layer and/or a functional region. In the context of a particularly preferred alternative development of the invention, it has been found to be advantageous that a first functional layer and/or a functional region bears a water-oxidizing catalyst in a surface of increased surface area of the cathodic back electrode and a second functional layer and/or functional region a water-reducing catalyst in a surface of increased surface area of the anodic front electrode, the ion exchange layer being in contact with the first functional layer and/or the second functional layer and/or a functional region. The choice of alternatives is connected to the choice of polarity of the photoelectric layer structure or photovoltaic cell. In the former case, the front electrode contacts an n-doped layer of the photoelectric layer structure; in the latter case, the front electrode contacts a p-doped layer of the photoelectric layer structure.

More particularly, the conductive and corrosion-inhibiting coupling layer is applied directly between a structural layer of a photoelectric layer structure and a front electrode of an electrochemical reactor. The structural layer is especially an n- or p-doped semiconductor stack of pin structure. In the case of a tandem or triple solar cell, the photoelectric layer structure preferably forms the bottom solar cell.

Preferably, the conductive and corrosion-inhibiting coupling layer takes the form of a passivation layer and/or has been applied as a metallic layer. It has been found to be especially preferable that the conductive and corrosion-inhibiting coupling layer is metallic. With regard to effective electrode coupling between light-absorbing systems and redox system, a corrosion-inhibiting coupling layer based on graphite, silver or stainless steel or other electrolyte-resistant metals has been found to be particularly suitable. More particularly, a coupling layer may be based on conductive metal oxides or mixed metal oxides or metal nitrides and/or alloys thereof.

A corrosion-inhibiting layer has been found to be particularly effective in the case of a tandem solar cell. Especially of a tandem solar cell with a pin structure based on silicon, namely especially amorphous silicon (a-Si) and microcrystalline silicon (μc-Si) in the form of a thin-film solar cell found. The combination of a tandem solar cell based on a-Si and μc-Si firstly enables—even as opposed to triple solar cells—a comparatively thin assembly which is easy to produce on the industrial scale, which, protected by the corrosion-inhibiting layer, allows good electron transport into the electrochemical cell.

More particularly, a photovoltaic side of the photoelectrochemical cell can also be optimized, for example through the choice of broad-band and efficient light absorbers, for instance through selection of suitable semiconductor materials or single-wide-band-gap or multi-junction cells. A prerequisite is provision of a photovoltage of greater or equal to 1.4 V, which is required for the water splitting, between the front electrode and the back electrode of the electrochemical cell, without having to accept excessive thermalization losses.

It is possible with the aid of tandem cells to generate a photovoltage much greater than 1.23 V, which is the least required for the water spitting. The extension of the tandem cell concept to a triple cell concept additionally enables the generation of higher photovoltages and hence the compensation of overvoltage in the preparation of hydrogen under high current densities, which are preferably between 20 mA/cm$^2$ and 100 mA/cm$^2$; this is an advantageous prerequisite for industrial scale production. This advantage is in principle also offered by a photovoltaic cell configured as a single-junction solar cell based on a semiconductor material having a band gap greater than 1.6 V, for example basis of group III-V, II-VI or IV-IV semiconductor compounds, preferably based on GaP, ZnTe, CdSe, CdS or SiC. These or other "wide band gap" materials in principle also have the advantage of generation of higher photovoltages with compensation of overvoltages. The principle of a superstrate solar cell (solar cell which is applied to a transparent carrier as the substrate) has long been known and is used particularly in the case of thin-film solar cell on glass as the carrier material to obtain electrical energy. However, this cell type has not yet been used to date as the basis for an electrochemical cell for water splitting by means of light. The combination of the two technologies within the context of the inventive concept has been found to be successful from efficiency optimization aspects.

Figure 2:
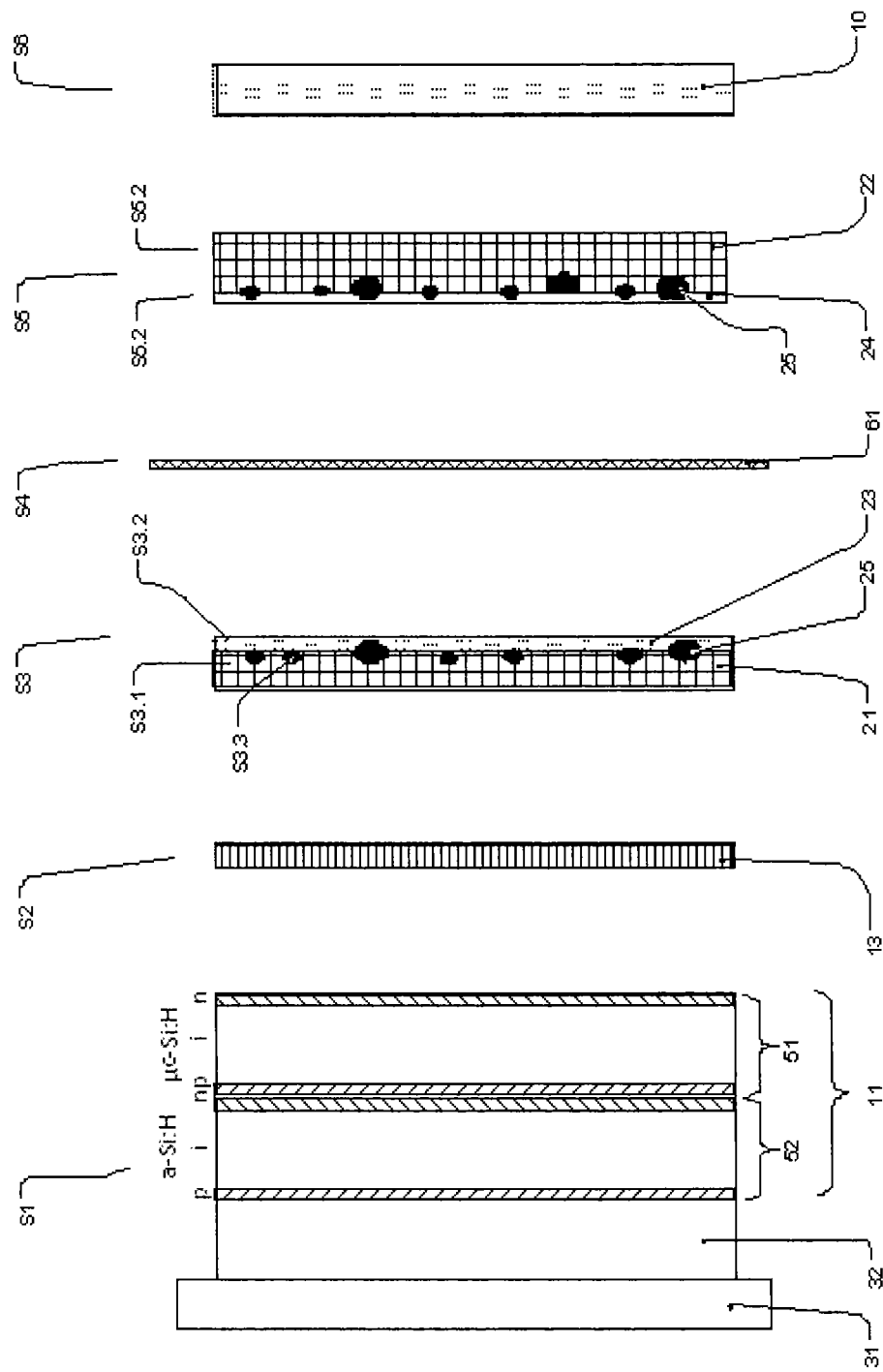

Working examples of the invention are now described hereinafter with reference to the drawing in comparison to the prior art, which is likewise described in part. This is not necessarily intended to show the working examples to scale; instead, the drawing, where useful for illustration, is executed in schematized and/or slight distorted form. For further details of the teachings immediately evident from the drawing, the relevant prior art is cited. It should be noted that various modifications and changes relating to the form and the detail of an embodiment may be undertaken without departing from the general idea of the invention. The features of the invention disclosed in the description, in the drawing and in the claims may be essential to development of the invention, either individually or in any combination. In addition, the scope of the invention includes all combinations of at least two of the features disclosed in the description, the drawing and/or the claims. The general idea of the invention is not restricted to the exact form or the detail of the preferred embodiment shown and described hereinafter, or restricted to a subject which would be limited compared to the subject claimed in the claims. When measurement ranges are specified, values within the limits mentioned shall also be disclosed as limiting values and shall be usable and claimable as desired. Further advantages, features and details of the invention are evident from the description of the preferred working examples which follows, and on the basis of the drawing, which shows, in:

FIG. 1. a particularly preferred embodiment of a photoelectrochemical cell for light-driven production of hydrogen and oxygen from water or an electrolyte based on aqueous solution and having an a-Si- and μc-Si-based tandem photovoltaic cell and an electrochemical cell, both of which are integrated in a fully optimized layer assembly of the PEC, i.e. integrated by means of a photoelectric layer structure and an electrochemical layer structure in the context of a sequence of layers whose electrically properties have been matched to one another, applied individually in assembly direction;

FIG. 2. an exploded diagram of the cell shown in FIG. 1 for illustration of a production process with implementation of the fully integrated assembly.

FIG. 1 shows a photoelectrochemical cell (PEC) 100 on the basis of the in principle its mode of action for light-driven production of hydrogen $H_2$ and oxygen $O_2$ from water or another electrolyte 10 based on aqueous solution—here a 0.1M $H_2SO_4$ aqueous solution in the acidic range with a pH of about 1—which is stored in a reservoir space or similar device and is available for further conversion. The photoelectrochemical cell 100 has a photoelectric layer structure 1 and an electrochemical layer structure 2. In the present case, the photoelectric layer structure 1 comprises an integrated layer assembly of a solar cell 11 on a front side 41 of a very substantially monolithic and fully integrated layer assembly 40. The electrochemical layer structure 2 comprises a further integrated layer assembly of an electrochemical reactor 12 on a back side 42 of the very substantially monolithic and fully integrated layer assembly 40; namely, more particularly, an arrangement of an electrode structure in the layer assembly 40, said structure also being suitable for accommodation of the electrolyte 10. Both the solar cell 11 and the electrochemical reactor 12 are implemented systematically in a fully integrated layer assembly 40. The integration of a solar cell 11 and of an electrochemical reactor 12 to give the photoelectrochemical cell PEC 100 is effected via electrical contacting in a conductive, corrosion-inhibiting coupling layer 13. The fully efficiency-optimized integrated layer assembly 40 is formed layer by layer by means of a photoelectric layer structure 1, the coupling layer 13 and the electrochemical layer structure 2.

Light 3 from a light source 4, for example sunlight or artificial light, falls through an entry window—here a substrate 31 made of glass for the solar cell 11—directly onto the active pin structures of the solar cell 11 and generates electron-hole pairs there, which are separated in the electrical gradient field of the pin structures within the solar cell 11. In the present context, high-energy light components 3.1, especially the visible and ultraviolet spectrum (VIS, UV), are absorbed in a front structure of a top solar cell 51, and low-energy, especially infrared (IR), light components 3.2 in a back structure of a bottom solar cell 52. Electrode-hole pairs are generated over maximum bandwidth both for a visible and an infrared component of the light. The top and bottom solar cells 51, 52 each take the form of a pin semiconductor structure, namely for generation of a photovoltage greater than 1.5 V. For this purpose, the top solar cell 51 is formed on the basis of amorphous a-silicon as an a-Si:H pin structure, and the back bottom solar cell 52 on the basis of microcrystalline silicon, namely as a μc-Si:H pin structure.

For economic generation of a sufficient photovoltage for electrochemical water splitting, thin-film silicon solar cells are especially suitable, these being optimized for use in the overall module on the basis of tandem solar cell technology. In this context, more particularly, a matching of what is called the open-circuit voltage $V_{oc}$ to the demands of hydrogen production should be undertaken. In order to compensate for anodic and cathodic overvoltages in the water splitting, $V_{oc}$ should advantageously be about 1.6-1.8 V. At the same time, the voltage at what is called the maximum power point $V_{MPP}$ should not be too far below $V_{oc}$, since there is otherwise insufficient efficiency of the electrochemical reaction. For this purpose, what is required is the implementation of stack solar cells with optimal current matching between the sub-cells with optimized $V_{oc}$ and high cell efficiency. The solar cell 11 is applied as a tandem cell composed of top solar cell 51 and bottom solar cell 52 on a front side contact 32 composed of a transparent conductive material—here a TCO layer—which is in turn applied on the substrate 31 made of glass. In an alternative, the substrate 31 may also be removable again. A coupling layer and/or a front side contact 32 may quite generally take the form of a transparent and/or conductive layer assembly which is to remain on a front side of the thin-film solar cell alone or with the substrate as part of the entry window on the front layer stack 14.

The conductive corrosion-inhibiting layer 13 is applied to the rear of the bottom solar cell 52, namely at the n-doped structural layer 52n labelled there as n. Overall, the layer stack of the layers with reference numerals 51, 52, 13 serves for generation of charge carriers by means of the light 3 incident through the window formed from layers of the substrate and front layer stack 31, 32; the charge carriers are led off to the electrolyte/solid state interface at a first front electrode 21—here a cathode—opposite a back electrode 22—here an anode. The charge carriers thus build up a potential between cathode and anode and hence drive a hydrogen evolution reaction, abbreviated to HER. This serves to generate and remove the portions of hydrogen $H_2$ and oxygen $O_2$ symbolized by arrows in the reaction space. The reaction space is formed here by functional layers 23, 24 in contact with the ion exchange layer 61. The charge is balanced by means of an externally processed conductor track 5, which ensures the return flow of electrodes via the front side contact 32. The functional layers 23, 24 in the context of the electrode structure may also take the form of functional regions integral to the front and/or back electrodes 21, 22.

The ion exchange layer 61 required for formation of the electrochemical cell 2 is arranged between the front electrode 21 and the back electrode 22. For acceleration of the electrochemical reaction at the front and back electrodes 21, 22, each of these is covered with a functional layer, namely a first functional layer 23 for the front electrode and a second functional layer 24 for the back electrode. Both of these provide a surface of increased surface area for the electrodes 21, 22. The functional layers 23, 24, or the pore openings or similar accommodation regions thereof, are accessible to the electrolyte 10, such that the water dissociation ultimately takes place in the surface area-increasing accommodation regions of the functional layers 23, 24, or at the boundary to a solid region of the assembly of the front and back electrodes 21, 22, which is accessible neither to the electrolyte 10 nor to the reaction gases $H_2$, $O_2$. The first functional layer 23 has an inner surface of increased surface area, which has been modified with a catalyst 25 which serves for acceleration of the water dissociation and hence of the production of hydrogen $H_2$. In this respect, the catalyst 25 has one or more active components accommodated in a carrier material of the functional layer 23. An active component of a catalyst 25 supported by the electrode structure of the front electrode 21 is based on transition metal compounds or mixtures of transition metal compounds, especially using element compounds of transition groups IV to XII; more particularly, the active components may be based on elements selected from the group comprising: Ti, V, Cr, Mo, W, Mn, Fe, Ru, Co, Ni, Cu, Zn. A support material of a catalyst 25 supported here by the electrode structure of the front electrode 21—and optionally also of the back electrode 22—may be formed on materials based on elements or element compounds of main groups II to IV and/or of transition group IVb. More particularly, materials based on carbon materials and/or based on oxides or mixed oxides of one or more elements selected from the group comprising: Al, Si, Ti, Zr have been found to be useful. More particularly, a functional layer 23, 24 and/or functional region provided for conversion of the water in the electrolyte 10 may be based on carbon or graphite.

Since the semiconductor layers of solar cells in direct contact with aqueous solution are generally electrochemically susceptible or unstable, in the present case, the solar cell 11 on the side facing the electrolyte 10 is protected by a corrosion-inhibiting coupling layer 13 which takes the form of a conductive passivation layer. Passivation layers with comparatively good inhibition of corrosion or corrosion protection are usually opaque, but this unimportant in the present case of assembly of a photoelectrochemical cell. In fact, the conductive passivation layer may additionally have light-reflecting properties, in order to increase light absorption in the solar cell structure of the bottom and top solar cell 51, 52. This is because, in the present case, the side of the photovoltaic cell 1 in contact with the water or another aqueous or solid electrolyte 10 cannot be illuminated; in this respect, a dark reaction takes place in the electrochemical cell PEC. In the present case, the conductive passivation layer is implemented as a true anticorrosion layer by means of a thin continuous silver layer which need only have a thickness of a few hundred nm. This additional passivation layer 13 prevents the semiconductor layers of the solar cell 11 from dissolving in the aqueous electrolyte 10 without hindering the charge transport of the charge carriers produced by incidence of light in the solar cell 11. The passivation layer in the present case—namely made from silver—is also selected such that it can be applied easily to the front electrode 21—here namely the cathode for water reduction of hydrogen. The front electrode 21 is formed overall from porous conductive material and has a first functional layer 23 likewise composed of porous material, which supports catalytic material of the catalyst 25 in the form of platinum nanoparticles. The back electrode 22 may be provided with a catalyst 25 in the same way.

Between the front electrode 21 and the—in the present case particularly advantageously—likewise porous back electrode 22—in this example the anode for water oxidation to oxygen $O_2$—is the aforementioned ion exchange layer 61 in the form of an ion-conducting membrane. This ion exchange layer 61 may take the form of a membrane, or else of a frit or other ion-exchanging but gas diffusion-inhibiting filter material, and separates the front electrode space 27 from the back electrode space 28 for water or oxygen production. The electrode spaces 27, 28 include, in the present case, all regions which can be permeated by water or aqueous or solid (e.g. acidic or basic PEM) electrolytes 10, i.e. essentially the porous regions of the functional layer 23, 24 provided with orifices or the perforated or other porous regions of the front electrode and back electrode 21, 22. At least one of the electrode spaces 27, 28 is filled with water or another aqueous electrolyte 10 and thus provides reaction spaces for the water dissociation. The aqueous electrolyte 10 here takes the form of an aqueous 0.1M $H_2SO_4$ solution, the pH of which is about pH=1. The choice of an acidic medium is possible in the present case, since the conductive passivation layer 13 sufficiently protects the photoelectric layer structure 1. The result is that the ion exchange layer 61 prevents the mixing of the product gases $H_2$ and $O_2$ and the reverse reaction thereof to give water.

In the present case, the formation of an integrated layer assembly 40 of the photoelectrochemical cell 100, a face-to-face arrangement of the front electrode 21 with functional layer 23 and of the back electrode 22 with functional layer 24 in direct contact with the ion exchange layer 61 is implemented. The electrode distance between front electrode 21 with functional layer 23 and back electrode 22 with functional layer 24 is reduced virtually to the thickness of the ion exchange layer 61. This enables a distinct optimization of resistance of the electrolyte 10 in the photoelectrochemical cell 100. On the other hand, in the present case, by means of the porosity, an accommodation region is provided for water or the aqueous electrolyte 10, and this serves for formation of sufficiently large reaction spaces in the electrode spaces 27, 28.

FIG. 2 shows, on the basis on the particularly preferred embodiment of a photoelectrochemical cell PEC 100 assembled in a fully integrated manner, shown by way of example in FIG. 1, a production process therefor. As explained above, in one variant, a solar cell 11 can be provided in a first process step S1 from standard fabrication, in order then to be produced further. The principle of the "superstate" solar cell used is used here, with utilization of a thin-film solar cell to obtain electrical energy for the water dissociation, in an electrochemical cell for water splitting by means of light. In a second variant not shown here specifically, the solar cell 11 may also be formed by means of a photoelectric layer structure 1 to be formed layer by layer, in which case—more particularly without process interruption—the coupling layer 13 and the electrochemical layer structure 2 are subsequently applied.

The tandem solar cell 11 here takes the form of a thin-film solar cell. In the present case, an a-Si/μc-Si-based tandem solar cell is suitable as a "superstate" solar cell. In addition, it is found that the p and n layers of the top and bottom solar cell 51, 52—typically of thickness about 1 to 20 μm—generate an electrical field which extends over the intrinsic layer (i layer) and leads to efficient collection of the charge carriers absorbed in the i layer. Through the use of two absorber materials with different energy gap, the solar spectrum is utilized selectively, i.e. with high-energy light components 3.1 and low-energy light components 3.2; overall, the photon yield is thus increased. The photovoltage of the overall solar cell 11 is above the maximum achievable photovoltages of the sub-cells. It is thus possible to generate the voltage of $V_{OC}$~1.4 V required for water splitting. Since thermalization losses are reduced in such a layer system, multi-spectral cells have a higher theoretical efficiency. The base materials used for the pin and nip layers are in the present case and a-Si and μc-Si having band gaps of about 1.8 and 1.1 eV respectively. The light thus falls through a substrate 31 made of glass into the a-Si top cell 51 which has a layer thickness of a few hundred nm and absorbs the short-wave portion of the solar spectrum. The lower bottom cell 52 which absorbs the long-wave light has a thickness of a few micrometers. The front side contact 32 of the component is formed by transparent conductive and oxide layers (TOO), which are utilized in combination with a silver film as a highly reflective back contact. This concept has to date led to efficiencies of 9 to 10% for industrially manufactured cells, and in some cases even to 14% for research cells. The high reflective back contact in the form of a silver film is not shown separately in the present case, since the back-scatter of unabsorbed photons can be converted by means of the conductive coupling layer 13 in the form of a passivation layer. In principle, it is also possible to provide other passivation layers based on aluminium or based on stainless steel, which are optimized or additionally further processed under suitable growth conditions for sufficient back-reflection. It is also possible to apply a separate back-reflection layer, such as the silver layer mentioned here.

The a-Si and μc-Si structures can be deposited by PECVD or hot-wire PVD processes at temperatures of 100 to 300° C. and thus allow utilization of inexpensive substrates, for example glass, for the substrate 31. In addition, the solar cells are produced in pin or nip stack sequences in order to improve charge carrier collection. In addition, solar cells with different spectral sensitivity can be combined to give tandem or triple cells. If there has not yet been any passivation on the back side of the solar cell 11, i.e. on the end layer of the bottom solar cell 52 as shown in FIG. 2, a back silver contact can be utilized as a passivation layer, or the passivation layer can be applied as a coupling layer 13 in a second process step S2. This can be effected by simple metal deposition. For this purpose, a passivation layer having a thickness of a few nanometres is sufficient, in some case also even within the range between 10 nm and 50 nm. In a third step S3, a cathode—namely in a first operation S3.1 the actually solid electrode 21, in a second step S3.2 the porous functional layer 23 and a third step S3.3 the catalyst 25—is applied in chemical deposition steps. In a fourth step S4, an ion exchange layer 61 is applied. This may, for example, be a suitable ion exchange membrane, a frit, a nonwoven, an acidic or basic PEM or similar suitable ion exchange material. In a fifth process step S5, the porous functional layer 24 can first be applied directly to the ion exchange layer 61, and then the solid back electrode 22.

It is also possible to first provide, in a separate process not shown here, the combination of back electrode 22 and functional layer 24, in order then to be applied as a unit on the exchange layer. The choice of a variant depends on the thickness and on the material of the back electrode. It has been found that either one or the other variant is possible. More particularly, the direct process described here can be effected by applying the functional layer in the first step S5.1, followed by the application of the solid electrode in the second step S5.2, without any impairment of hydrogen production. In a sixth step S6, the containment for the electrolyte 10, here by way of example the aqueous 0.1M $H_2SO_4$ solution already mentioned, is finally installed.

FIG. 3 shows a variant of the cell shown in FIG. 2, in which oxygen is obtained in the front electrode space 27 and hydrogen in the back electrode space 28. The pin structural layers of the solar cells 51 and 52 are accordingly reversed and the current flows via the outside conductor track 5 in the opposite direction.

| List of reference numerals | |
|---|---|
| 1 | Photoelectric layer structure |
| 2 | Electrochemical layer structure |
| 3 | Light |
| 3.1 | High-energy light components |
| 3.2 | Low-energy light components |
| 4 | Light source |
| 5 | External conductor track |
| 10 | Electrolyte, especially water |
| 11 | Solar cell |
| 12 | Electrochemical reactor |
| 13 | Coupling layer |
| 14 | Front layer stack |
| 21 | Front electrode |
| 22 | Back electrode |
| 23 | First functional layer |
| 24 | Second functional layer |
| 25 | Catalyst |
| 27 | Front electrode space |
| 28 | Back electrode space |
| 31 | Substrate |
| 32 | Front side contact |
| 40 | Layer assembly |
| 41 | Front side |
| 42 | Back side |
| 51 | Top solar cell |
| 51p, 51i, 51n | Structural layers |
| 52 | Bottom solar cell |
| 52p, 52i, 52n | Structural layers |
| 61 | Ion exchange layer |
| 100 | Photoelectrochemical cell, PEC |
| S1, S2, S3, S3.2, S3.3, S4, S5, S5.1, S5.2, S6 | Process steps |

The invention claimed is:

1. A photoelectrochemical cell, comprising:
a photoelectric layer structure and an electrochemical layer structure in a layer assembly; and
a conductive and corrosion-inhibiting coupling layer which electrically contacts the photoelectric layer structure and the electrochemical layer structure to one another in the layer assembly,
wherein:
the photoelectric layer structure for absorption of light, and which is unaffected by electrolyte, forms a front side of the layer assembly;
the electrochemical layer structure, which accommodates the electrolyte, forms a back side of the layer assembly;
the electrochemical layer structure comprises an electrode structure of a front electrode and an electrode structure of a back electrode, between which an ion exchange layer is arranged such that the ion exchange layer is in contact with the electrode structure of the front electrode, the electrode structure of the back electrode, or both, to form an integrated layer assembly;
the photoelectrochemical cell is suitable for light-driven production of hydrogen and oxygen;
the electrode structure of the front electrode, the electrode structure of the back electrode, or both, has a functional layer, which is provided for conversion of the electrolyte and has been applied as a separate layer on a solid part of the front electrode, on a solid part of the back electrode, or both;
the functional layer has a functionality which is catalytic for conversion of water in the electrolyte at the front electrode, back electrode, or both;
an active component of a catalyst supported by the electrode structure of the front electrode, the back electrode, or both, is based on one or more of the elements selected from the group of Ti, V, Cr, Mo, W, Mn, Fe, Ru, Co, Ni, Cu and Zn; and
the electrolyte comprises a basic aqueous solution with a pH between 7.1 and 14.

2. The photoelectrochemical cell according to claim 1, wherein the photoelectric layer structure and the electrochemical layer structure are integrated as a sequence of layers applied individually in an assembly direction in a single layer sequence in the layer assembly.

3. The photoelectrochemical cell according to claim 1, wherein:
the photoelectric layer structure is in modular form, in the form of a photovoltaic cell,
the electrochemical layer structure is in modular form, in the form of an electrochemical cell,
or both of the photoelectrical layer structure and the electrochemical layer structure are in modular form, in the form of an electrochemical cell; and
the photoelectric layer structure and the electrochemical layer structure are assembled via the conductive and corrosion-inhibiting coupling layer in the layer assembly.

4. The photoelectrochemical cell according to claim 1, wherein at least one of the following conditions is satisfied:
a first functional layer on the front electrode is in contact with the ion exchange layer, and
a second functional layer on the back electrode is in contact with the ion exchange layer.

5. The photoelectrochemical cell according to claim 1, wherein:
a contact of the ion exchange layer with a functional layer provided for conversion of water in the electrolyte is a direct contact which extends at least in regions over a cross section of the functional layer; and
the contact optionally has a regular arrangement, an irregular arrangement, or both, of contact sites distributed over the cross section of the functional layer.

6. The photoelectrochemical cell according to claim 1, wherein:
the functional layer has a surface area-increasing functionality for the front electrode, the back electrode, or both; and
the functional layer optionally has pores, orifices or similar accommodation regions for the electrolyte.

7. The photoelectrochemical cell according to claim 1, wherein a catalyst supported by the electrode structure of the front electrode, the back electrode, or both, is in a particulate form, an immobilized molecular form, a solid form, a form of porous layers, or a combination thereof.

8. The photoelectrochemical cell according to claim 1, wherein a support material of a catalyst supported by the electrode structure of the front electrode, the electrode structure of the back electrode, or both, is formed from elements of main groups II to IV, elements of transition group IVb, or mixtures thereof, or compounds thereof.

9. The photoelectrochemical cell according to claim 1, wherein the electrolyte comprises a solution of alkali metal or alkaline earth metal salts of sulphuric acid, nitric acid, or an organic acid.

10. The photoelectrochemical cell according to claim 1, wherein the electrolyte comprises an aqueous solution.

11. The photoelectrochemical cell according to claim 1, wherein the ion exchange layer has an acidic or basic polymer electrolyte membrane.

12. The photoelectrochemical cell according to claim 1, wherein the photoelectric layer structure is applied as a thin-film solar cell on a transparent front layer stack, an at least partly conductive front layer stack, or both.

13. The photoelectrochemical cell according to claim 12, wherein a transparent and conductive front layer stack has an optically transparent conductive layer as a transparent substrate.

14. The photoelectrochemical cell according to claim 1, wherein the conductive and corrosion-inhibiting coupling layer is applied directly between a structural layer and a front electrode of an electrochemical reactor.

15. The photoelectrochemical cell according to claim 1, wherein the conductive and corrosion-inhibiting coupling layer is a passivating layer and/or is applied as a conductive layer.

16. The photoelectrochemical cell according to claim 1, wherein the photoelectric layer structure forms a multi-junction solar cell.

17. The photoelectrochemical cell according to claim 1, wherein a solar cell is formed on the basis of Si, SiGe, a III V semiconductor, or a combination thereof.

18. The photoelectrochemical cell according to claim 1, wherein the photoelectric layer structure forms a single-junction solar cell.

19. A system, comprising a multitude of the photoelectrochemical cells according to claim 1, wherein a first reaction space, a second reaction space, or both, of one photoelectrochemical cell is connected in a fluid-dynamic manner to a corresponding first reaction space, a corresponding second reaction space, or both, of another photoelectrochemical cell.

* * * * *